(12) United States Patent
Kojima et al.

(10) Patent No.: US 8,109,612 B2
(45) Date of Patent: Feb. 7, 2012

(54) WIRING SUBSTRATE, METHOD OF MANUFACTURING WIRING SUBSTRATE, AND LIQUID DROPLET EJECTION HEAD

(75) Inventors: Toshiya Kojima, Kanagawa (JP); Gentaro Furukawa, Kanagawa (JP)

(73) Assignee: Fujifilm CORPORATION, Tokyo (JP)

( * ) Notice: Subject to any disclaimer, the term of this patent is extended or adjusted under 35 U.S.C. 154(b) by 1404 days.

(21) Appl. No.: 11/510,591

(22) Filed: Aug. 28, 2006

(65) Prior Publication Data
US 2007/0049130 A1 Mar. 1, 2007

(30) Foreign Application Priority Data
Aug. 29, 2005 (JP) .................................. 2005-247743

(51) Int. Cl.
B41J 2/05 (2006.01)
B41J 2/14 (2006.01)
B41J 2/045 (2006.01)

(52) U.S. Cl. ................................ 347/58; 347/50; 347/68

(58) Field of Classification Search .............. 347/68–72, 347/50, 58; 310/330, 331, 365, 366; 174/255, 174/261
See application file for complete search history.

(56) References Cited

U.S. PATENT DOCUMENTS

| 4,458,256 A * | 7/1984 | Shirato et al. ................... 347/58 |
| 5,252,994 A * | 10/1993 | Narita et al. .................... 347/71 |
| 5,646,661 A * | 7/1997 | Asai et al. ....................... 347/69 |
| 2004/0113994 A1* | 6/2004 | Shinkai ............................ 347/68 |
| 2006/0044362 A1* | 3/2006 | Kim et al. ....................... 347/71 |

FOREIGN PATENT DOCUMENTS

| JP | 60-28293 | 2/1985 |
| JP | 60-502233 A | 12/1985 |
| JP | 63-241984 | 10/1988 |
| JP | 11-087618 A | 3/1999 |
| JP | 2002-290010 A | 10/2002 |
| WO | WO-85/01231 A1 | 3/1985 |

OTHER PUBLICATIONS

JP 2006-229474 Japanese Office Action, Mar. 18, 2011.

* cited by examiner

*Primary Examiner* — Geoffrey Mruk
(74) *Attorney, Agent, or Firm* — Birch, Stewart, Kolasch & Birch, LLP

(57) ABSTRACT

The wiring substrate having a recess section and a projecting section formed on at least one surface of the wiring substrate, and wires formed on both the recess section and the projecting section.

2 Claims, 10 Drawing Sheets

WIRING SUBSTRATE, METHOD OF MANUFACTURING WIRING SUBSTRATE, AND LIQUID DROPLET EJECTION HEAD

BACKGROUND OF THE INVENTION

1. Field of the Invention

The present invention relates to a wiring substrate, a method of manufacturing a wiring substrate and a liquid droplet ejection head, and more particularly, to a wiring substrate, a method of manufacturing a wiring substrate and a liquid droplet ejection head for achieving high-density wiring by forming wires respectively in a recess section and a projecting section.

2. Description of the Related Art

In the related art, it has been sought to reduce the size and weight of various electrical devices. For example, there have been demands for reducing the size and increasing the density of inkjet heads used in inkjet recording apparatuses, and the like.

In order to reduce the size of equipment, it is necessary to arrange the electrical wires which supply signals for driving the semiconductor elements, or the like, at a high density. Various technologies for manufacturing high-density wiring substrates have been proposed for accomplishing such high density wiring.

For example, a printed wiring substrate is known in which a first conducting layer is formed by electroless plating on the surface of a three-dimensional molding object made of an insulating resin which is formed with projecting sections and recess sections by extrusion molding, the surface is ground mechanically, a first conductive pattern is formed in the recess sections (grooves), and a wiring layer is formed in the recess sections (grooves) by forming a second conductive layer by electrolytic plating (electroplating) on the first conductive pattern. Furthermore, Japanese Patent Application Publication No. 2002-290010 discloses a printed wiring substrate which is manufactured as follows. A first conductive layer is formed by electroless plating on the surface of the three-dimensional molding object; whereupon a resist pattern is formed on a first conductive layer on the projecting sections; etching is carried out using the resist pattern as a mask; the resist pattern is peeled away so that a first conductive pattern is formed on the projecting sections; and whereupon a second conductive layer is formed by electroless plating on top of the first conductive pattern so that a wiring layer is formed on the projecting sections.

Furthermore, for example, Published Japanese Translation of PCT Patent Application, No. 60-502233, discloses a method of manufacturing a printed substrate in which grooves are formed in a substrate, the grooves in the substrate are filled with a conductive powder, pressure is applied to compress the powder in the grooves of the substrate, and the compressed powder is heated inside the grooves so that conductive channels (wires) are formed in the grooves in the substrate.

However, in the related arts described above, wires are only formed on either one of the recess sections or the projecting sections of the substrate, and wires are not formed simultaneously on both the recess sections and the projecting sections. Furthermore, patterns are formed by lamination. For example, if wires are formed only in the recess sections of the substrate, then it is difficult to achieve finer wiring or higher density. Furthermore, in a case of such lamination structure, the process is highly complicated, leading to increased costs or increased thickness.

SUMMARY OF THE INVENTION

The present invention is contrived in view of the aforementioned circumstances, an object thereof being to provide a wiring substrate and a method of manufacturing a wiring substrate, and a liquid droplet ejection head for achieving high-density wiring by means of a simple process, by using a single thin-film substrate, without increasing the thickness of the substrate.

In order to attain the aforementioned object, the present invention is directed to a wiring substrate comprising: a recess section and a projecting section formed on at least one surface of the wiring substrate; and wires formed on both the recess section and the projecting section.

According to this aspect of the present invention, it is possible to prevent a short-circuiting even if wires are formed adjacently on the substrate, and therefore high-density wiring can be achieved.

Preferably, the wire formed on one of the recess section and the projecting section serves as a signal line, and the wire formed on the other of the recess section and the projecting section serves as a drive line.

Preferably, the wire formed on the recess section and the wire formed on the projecting section have different resistance values.

According to this aspect of the present invention, noise can be reduced and wiring can be formed to a high-density.

Preferably, the recess section and the projecting section have non-uniform shape in such a manner that the wiring substrate is prevented from warping.

According to this aspect of the present invention, warping of the substrate can be prevented, and it is possible to provide a wiring substrate having excellent flatness, for example.

In order to attain the aforementioned object, the present invention is also directed to a method of manufacturing a wiring substrate comprising a recess section, a projecting section, and wires formed on both the recess section and the projecting section, the method of manufacturing a wiring substrate comprising the steps of: pressing a stamper having a recess portion and a projecting portion onto a metal thin film attached to a substrate in such a manner that a pattern of the recess portion and the projecting portion is transferred to the substrate and thereby a recess section and a projecting section are formed in the substrate; and carrying out an electroplating process on wire sections formed by the metal thin film adhering to the recess section and the projecting section in the substrate in such a manner that thickness of the wire sections is increased, after the stamper is detached from the metal thin film.

According to this aspect of the present invention, it is possible to manufacture a wiring substrate having a wiring pattern including wires formed on both the recess section and the projecting section, by means of a simple process. Therefore, the manufacturing process can be simplified and costs can be reduced.

Preferably, the method of manufacturing a wiring substrate further comprises a step of insulating the wire section formed on the recess section from the wire section formed on the projecting section.

Preferably, the wire section formed on the recess section is insulated from the wire section formed on the projecting section, by removing the metal thin film on a side of the projecting section in the substrate by means of the projecting portion having a coarse surface during an upward or downward movement of the stamper.

Preferably, a side of the projecting section in the substrate has a relief shape, in such a manner that no pressure is applied to the side of the projecting section in the substrate while the stamper is pressed onto the metal thin film attached to the substrate; and the wire section formed on the recess section is insulated from the wire section formed on the projecting section, by removing the metal thin film on the side of the projecting section in the substrate.

According to this aspect of the present invention, it is possible to reliably insulate wires which are laid in a mutually adjacent fashion, and the reliability of the apparatus can therefore be improved.

In order to attain the aforementioned object, the present invention is also directed to a liquid ejection head comprising one of the wiring substrates described above.

According to this aspect of the present invention, it is possible to provide a liquid droplet ejection head which achieves a high-density wiring arrangement.

According to the present invention, it is possible to prevent a short-circuiting even if wires are formed adjacently on the substrate, and therefore high-density wiring can be achieved.

BRIEF DESCRIPTION OF THE DRAWINGS

The nature of this invention, as well as other objects and benefits thereof, will be explained in the following with reference to the accompanying drawings, wherein.

DETAILED DESCRIPTION OF THE PREFERRED EMBODIMENTS

Figure 1:
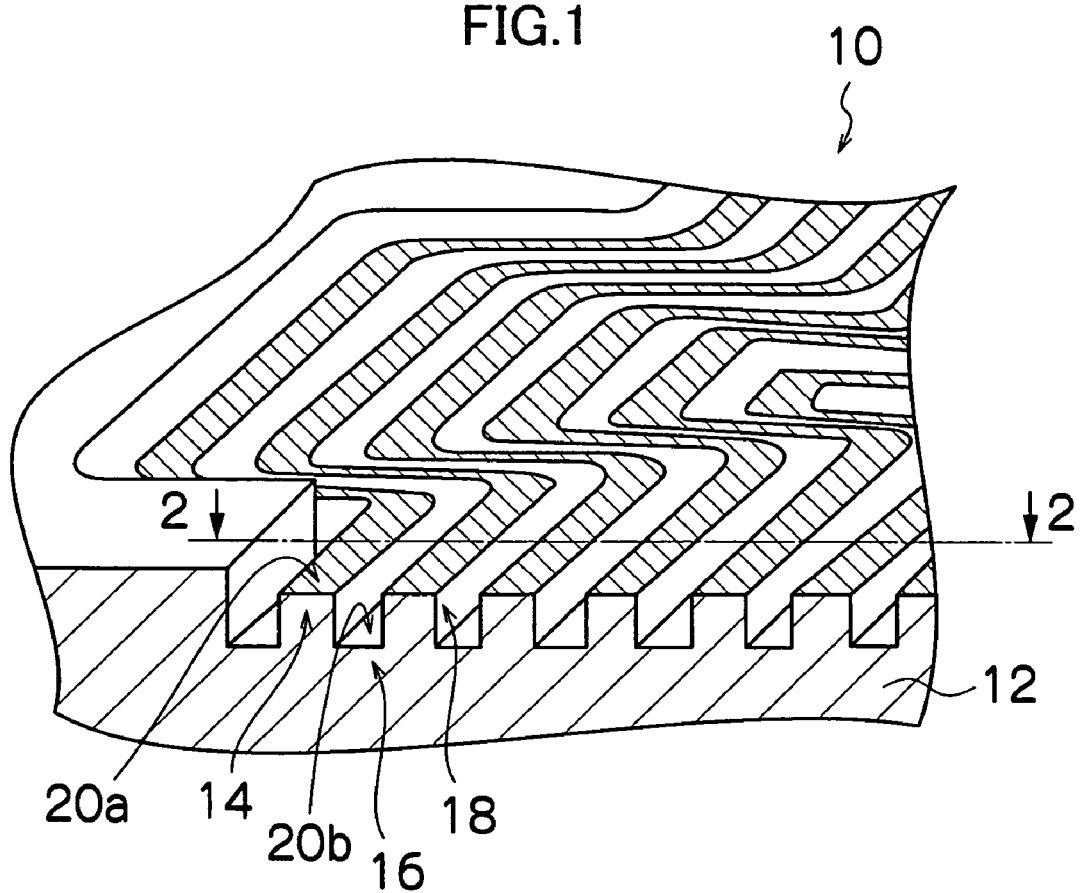
FIG. 1 is an oblique view of the general composition of a wiring substrate relating to one embodiment of the present invention.

FIG. 1 shows an oblique view of the general composition of a wiring substrate relating to one embodiment of the present invention.

In the present embodiment, a wiring pattern for achieving high-density wiring is formed by means of a single thin-film substrate.

As shown in FIG. 1, in the wiring substrate 10 according to the present embodiment, a substrate 12 is provided with an undulating shape including projecting sections 14 and recess sections 16, and wires 20a and 20b formed respectively in the projecting sections 14 (and more specifically, the surfaces of the peak sections of the projecting shapes) and the recess sections 16 (and more specifically, the surfaces of the bottoms of the groove shapes). The side faces 18 of the grooves between the projecting sections 14 and the recess sections 16 are insulated.

Furthermore, it is suitable to use a non-conductive material for the material of the substrate 12. There are no particular restrictions on the non-conductive material, and it is possible to use, for example, a resin such as an epoxy resin, a polyurethane resin, a silicone resin, or the like, or an insulating member such as prepreg, or the like. Moreover, although described in detail below, the wires 20a and 20b are formed by carrying out an electroplating processing on top of a thin metal film, for example.

The wiring pattern formed on the undulating shape in this way may be curved as shown in FIG. 1, the width of the wires may change somewhere along their length, and the wires may branch somewhere along their length. In this way, the wiring patterns are formed to a desired shape in accordance with the intended purpose. For example, even if there are holes or electronic components on the substrate, the wiring patterns can be formed away from these holes and electronic components.

Figure 2:
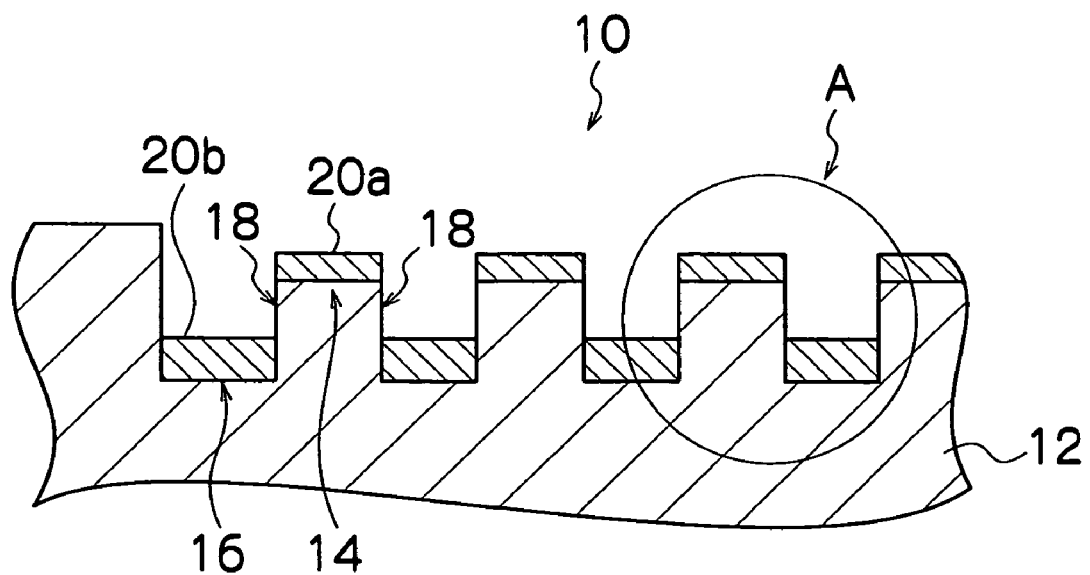
FIG. 2 is a cross-sectional diagram along line 2-2 in FIG. 1.

FIG. 2 is a cross-sectional diagram along the single-dotted line 2-2 in FIG. 1.

As shown in FIG. 2, the wiring substrate 10 has wires 20a and 20b formed respectively in the projecting sections 14 and recess sections 16 of the substrate 12 formed with an undulating shape, and the side faces 18 of the projecting sections 14 are insulated. Furthermore, FIGS. 3A and 3B show enlarged views of the portion indicated by the circle A in FIG. 2.

Figure 3A:
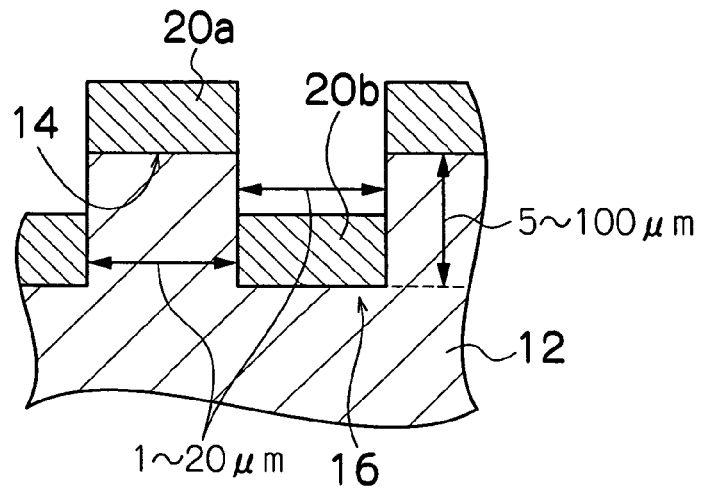
FIG. 3A is an enlarged diagram showing an enlargement of the portion of FIG. 2 indicated by the circle A.

FIG. 3A shows one embodiment of the approximate dimensions of the undulating shape of the substrate 12. As shown in FIG. 3A, for example, the projecting sections 14 and the recess sections 16 each have a width in the range of 1 to 20 μm, and the projecting sections 14 have a height in the range of 5 to 100 μm. This is merely one embodiment, and the dimensions of the undulating shape is not limited to this embodiment.

Figure 3B:
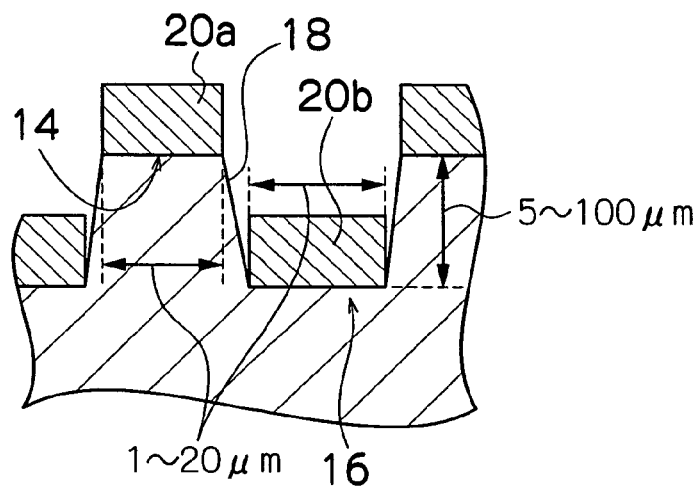
FIG. 3B is an illustrative diagram showing a further embodiment of this portion.

Furthermore, FIG. 3B shows a further embodiment of the undulating shape of the substrate 12. The approximate dimensions of the undulating shape are the same as those in FIG. 3A, but in this embodiment, the side faces 18 of the projecting sections 14 are formed in a tapered shape, and the openings of the recess sections 16 become gradually wider toward the top from the bottom surface of the recess sections 16.

FIG. 3A shows a shape suitable for the high-density wiring; however, since the wires on the projecting sections and recess sections are present nearby, it is difficult to apply high-electric power to this wiring substrate. Furthermore, since the wires have a susceptibility to the noise caused by the wires, the shape shown in FIG. 3B is preferred in the case of signal lines or drive lines.

Figure 4:
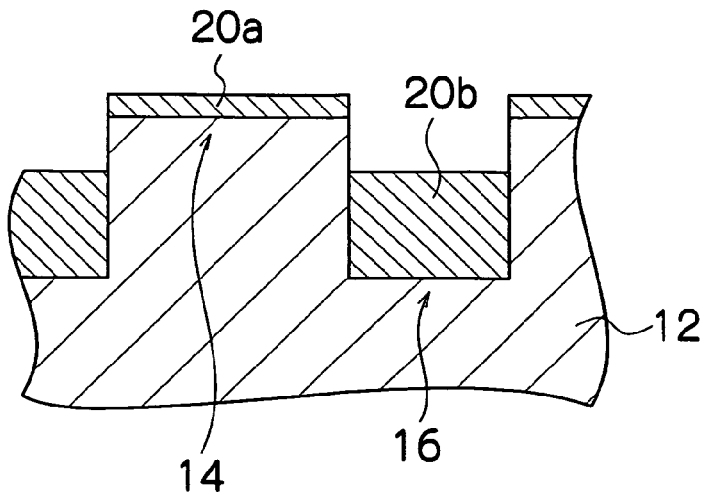
FIG. 4 is a cross-sectional diagram showing a further embodiment of wiring formed in an undulating shape.

Furthermore, it is possible to create a difference in the electrical resistance between the wires 20a formed on the projecting sections 14 and the wires 20b formed in the recess sections 16, by altering the wiring cross-section (for example, as shown in FIG. 4, by making the width of the projecting sections 14 greater than the width of the recess sections 16, or by varying the thickness of the wiring members) By achieving different electrical resistances in this way, it is possible to achieve electrical conduction at different current values or different voltage values, respectively, in the wires 20a formed in the projecting sections 14 and the wires 20b formed in the recess sections 16.

By achieving electrical conduction at different current values or voltage values in the wires 20a and the wires 20b, it is possible to selectively use sets of wires 20a and 20b according to different uses. For example, the wires 20b in the recess sections 16 may be used for power supply and the wires 20a in the projecting sections 14 may be used for control signals. By using these wires selectively, the signal lines can be prevented from being affected by the noise generated from the wires for power supply.

The resistance values of the wires 20a and 20b can be controlled by means of the cross-sectional width of the wires (the width of the projecting sections 14 and the recess sections 16), and the thickness of the wiring members. As shown in FIG. 4, due to the adhesive force between the substrate 12 and the wiring member, the wires 20b formed in the recess sections 16 can be formed as thick films, but it is difficult to form the wires 20a on the projecting sections 14 as thick films. Therefore, if a cross-sectional area of each of the wires 20a on the projecting sections 14 is required to be adjusted to a certain dimension, then the width of each of the projecting sections 14 is required to be adjusted according to the cross-sectional area.

Furthermore, since an undulating shape is formed on one surface of the substrate 12 in this way, then warping of the substrate 12 may occur. In order to prevent this warping, it is possible to form the undulating shape in a non-uniform fashion.

Figure 5A:
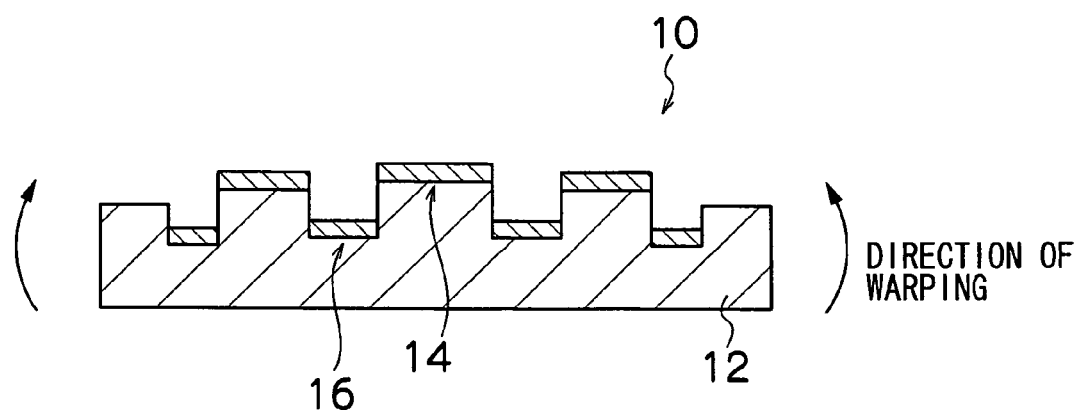
FIGS. 5A and 5B are illustrative diagrams showing the form of an undulating shape which prevents warping of the substrate.
Figure 5B:
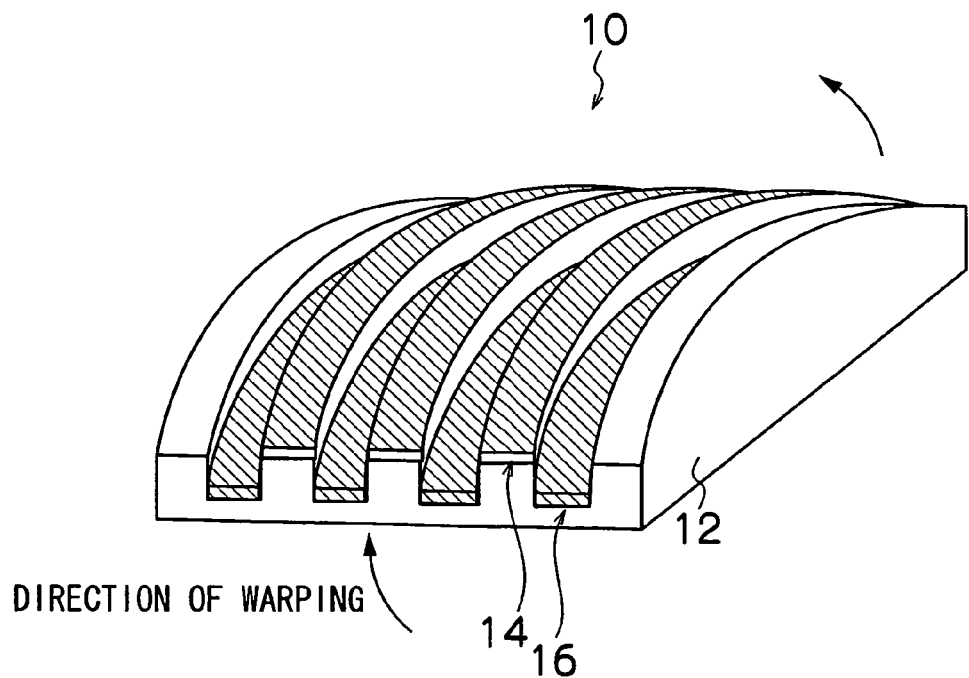

For example, as shown in FIG. 5A, if the substrate 12 warps in such a manner that it becomes convex in the downward direction as indicated by the arrow in the diagram, then a shape of wiring is formed by modifying the undulating shape in a vertical direction with respect to the wiring direction in such a manner that the bottom surfaces of the recess sections 16 in the central portion of the substrate 12 are higher and the bottom surfaces of the recess sections 16 gradually become lower toward the left and right-hand sides, so that the bottom surfaces of the recess sections 16 have an overall curvature opposite to the direction of warping of the substrate 12. Moreover, as shown in FIG. 5B, if the substrate 12 warps, a shape of wiring can be adjusted in such a manner that the undulating shape is changed according to a horizontal direction with respect to the wiring direction (i.e., the undulating shape is modified in the horizontal direction).

Next, a method of manufacturing a wiring substrate 10 is described below.

FIGS. 6A to 6D show steps for manufacturing a wiring substrate 10.

Figure 6A:
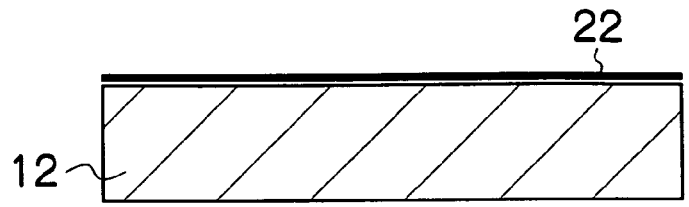
FIGS. 6A to 6D are illustrative diagrams showing steps for manufacturing a wiring substrate.

Firstly, as shown in FIG. 6A, a metal thin film 22 of copper foil, or the like, is attached tightly onto the substrate 12.

There are no particular restrictions of the material of the substrate 12, and for example, as described above, an insulating member, such as resin or a prepreg, can be used. Furthermore, instead of attaching the metal thin film 22 tightly to the substrate 12, it is also possible to apply electroless plating processing on the substrate 12, or to apply metal microparticles onto the substrate 12.

Figure 6B:
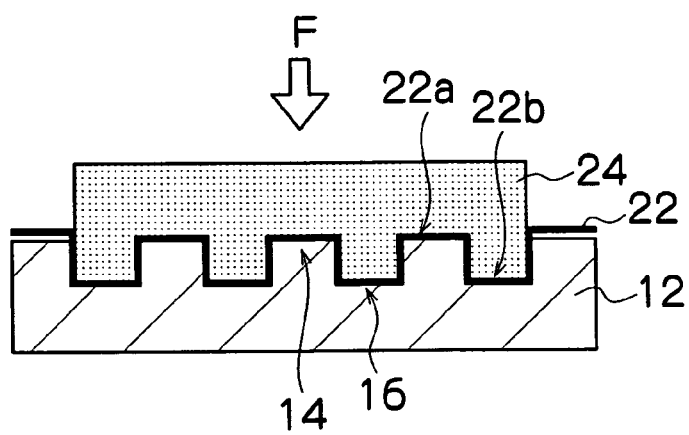

Next, as shown in FIG. 6B, using a stamper 24 formed with a wiring pattern in an undulating shape, the undulating shape of the wiring pattern is transferred to the substrate 12 which has the metal thin film 22 tightly attached to the surface thereof. There are no particular restrictions on the method of forming the wiring pattern of undulating shape in the stamper 24, and it may be formed, for example, by laser processing using an excimer laser, or mechanical processing, etching, or the like.

In this case, as shown in FIG. 6B, the metal thin film 22 is bonded to the substrate 12 by applying a pressure F. Moreover, it is also possible to apply heat in this process. Thereby, the undulating shape of the wiring pattern formed by the stamper 24 is transferred to the substrate 12. In this case, the metal thin film 22 attached tightly to the substrate 12 is divided by the shearing force of the stamper 24 into metal thin films 22a attached tightly to the upper surfaces of the projecting sections 14 of the substrate 12 and metal thin films 22b attached tightly to the bottom surfaces of the recess sections 16.

The metal thin films 22a attached tightly to the upper surfaces of the projecting sections 14 of the substrate 12 and the metal thin films 22b attached tightly to the bottom surfaces of the recess sections 16 form the bases for conducting layers by electroplating conducted in the subsequent process.

Figure 6C:
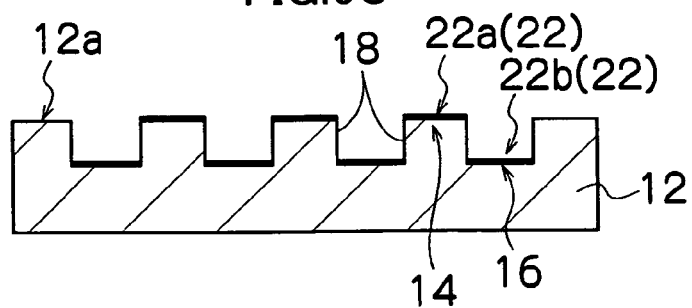

Thereupon, as shown in FIG. 6C, the stamper 24 is removed, and a substrate 12 is obtained which has metal thin films 22 (22a and 22b) bonded tightly to the upper surfaces of the projecting sections 14 and the bottom surfaces of the recess sections 14. In this case, the metal thin films 22a on the upper surfaces of the projecting sections 14 and the metal thin films 22b on the bottom surfaces of the recess sections 16 are torn apart and hence there is virtually no metal thin film 22 adhering to the side faces 18.

However, if a metal thin film 22 appears to be remaining on the side faces 18, then the metal thin film 22 on the side faces 18 is required to be removed. If this is not done, then there is a possibility of the occurrence of a short-circuiting between the wires formed on the projecting sections 14 and the wires formed in the recess sections 16. Furthermore, the end sections 12a of the substrate 12 shown in FIG. 6C are sections that are not required for forming the wires, and since they are not pressurized by the stamper 24, a metal thin film on each end section 12a can simply be removed.

Moreover, even supposing a metal thin film 22 is left on the side faces 18, pressure by the stamper 24 is not applied to the side faces 18, and therefore the adhesive force between the metal thin film 22 and the side faces 18 is weak. Accordingly, such a metal thin film 22 can be removed easily, by air-blowing, a water jet, or the like.

Furthermore, it is also possible to suitably devise the undulating shape of the stamper 24 so that the metal thin film 22 on the side faces 18 is removed or no metal thin film 22 is left on the side faces.

Figure 7A:
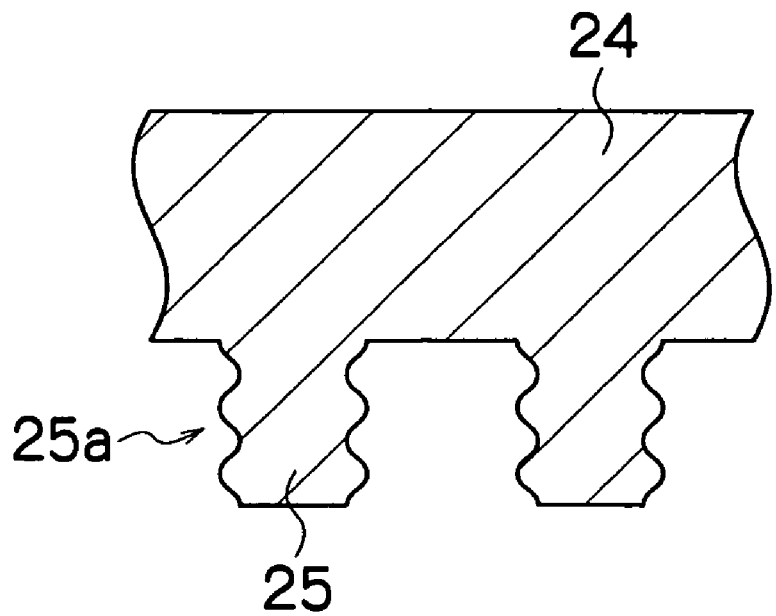
FIGS. 7A and 7B are illustrative diagrams showing a method for removing a metal thin film from the side faces of an undulating shape.

For example, as shown in FIG. 7A, if the surface roughness of the side faces 25a of the projecting sections 25 of the stamper 24 is made coarse, and the coarse side faces 25a are rubbed against the side faces 18 of the projecting sections 14 of the substrate 12 by moving the stamper 24 upward or downward, then it is possible to remove the metal thin film 22 on the side faces 18 of the projecting sections 14 of the substrate 12. In such a case, a reliable removal of the metal thin film 22 is possible by repeatedly moving the stamper 24 upward and downward.

Figure 7B:
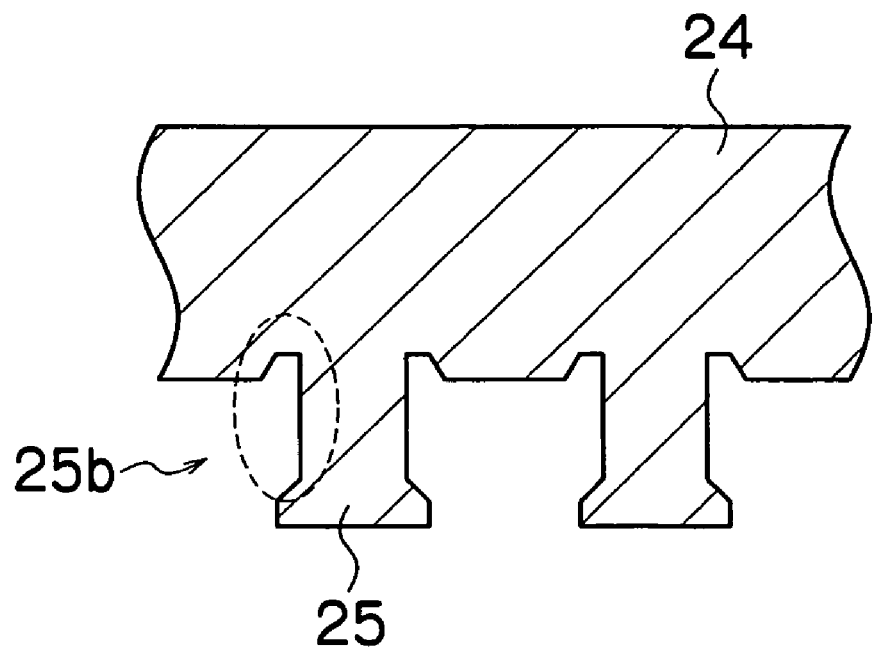

Alternatively, as shown in FIG. 7B, relief shapes 25b may be provided on the projecting sections 25 of the stamper 24, in such a manner that less pressure (including no pressure) is applied to the side faces 18 of the projecting sections 14 of the substrate 12, and the metal thin film 22 on the side faces 18 which have weak adhesive force can then be removed by means of an air blower, for example. The method shown in FIG. 7A is suitable for reliable removing the metal thin film 22; however, if it becomes difficult to maintain the reliability because the side faces of the stamper are worn out or because large-scale production is carried out, for example, then the method shown in FIG. 7B can be suitable.

Figure 6D:
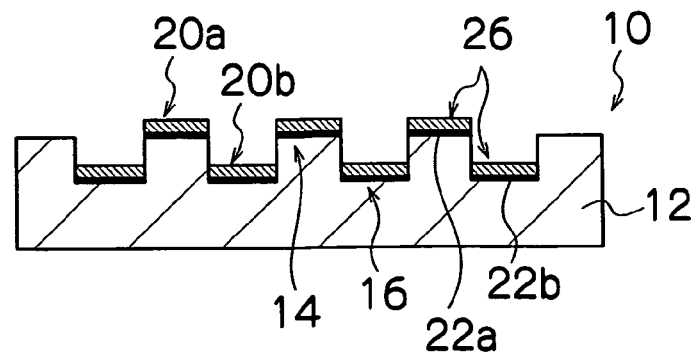

Thereupon, as shown in FIG. 6D, electroplating is carried out on the bases formed by the metal thin films 22*a* and 22*b* adhering to the projecting sections 14 and recess sections 16 of the substrate 12, conductive layers are formed by depositing thick films of conductive material on the metal thin films 22*a* and 22*b*, and thus wires 20*a* and 20*b* are formed. Consequently, a wiring substrate 10 is formed in which the wires 20*a* and 20*b* are formed on the projecting sections 14 and the recess sections 16 of the undulating shape.

In this way, according to the present embodiment, wiring patterns are formed respectively on the recess sections and the projecting sections of a single member. Accordingly, it is possible to achieve high-density wiring without increasing the thickness of the substrate, it is possible to simultaneously form wires having different electrical resistances in accordance with the undulating shape, and furthermore, it is possible to prevent warping of the wiring substrate.

Furthermore, in the process of manufacturing the wiring substrate, the conductive patterns are formed simultaneously with the formation of the projections and recesses by means of the stamper. Accordingly, there is no need for complicated steps, such as forming resist patterns and then removing the resist patterns. Hence the manufacturing process can be simplified, and cost reductions can be achieved.

Next, a further method of manufacturing a wiring substrate is described below.

FIGS. 8A to 8F show steps of a further method of manufacturing a wiring substrate.

Figure 8A:
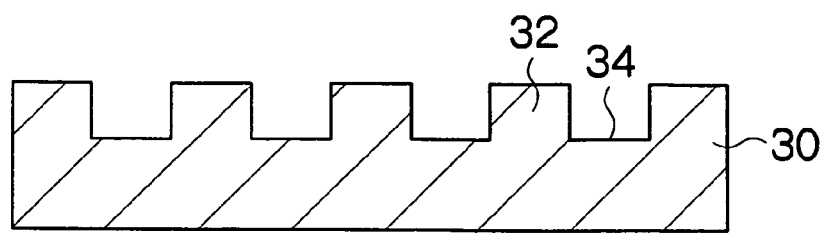
FIGS. 8A to 8F are step diagrams showing a further method of manufacturing a wiring substrate.

Firstly, as shown in FIG. 8A, a substrate 30 which is formed with wiring patterns in an undulating shape by resin molding, for example, is prepared. Projecting sections 32 and recess sections 34 are formed in the substrate 30, which is made of resin, in accordance with a prescribed wiring pattern.

Figure 8B:
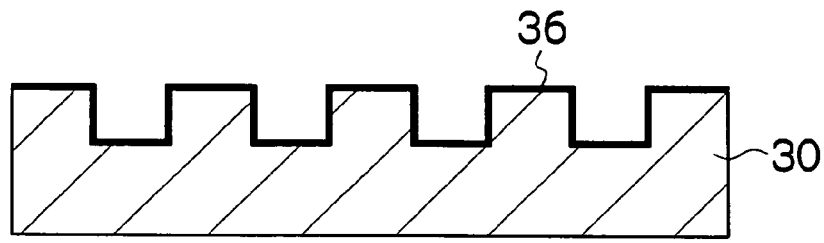

Thereupon, as shown in FIG. 8B, electroless plating is carried out over the whole surface of the substrate 30 formed with an undulating shape, thereby forming a plating layer (conductive layer) 36 which serves as a base for subsequent electroplating. Before carrying out the electroless plating, the surface of the resin may be roughened.

Figure 8C:
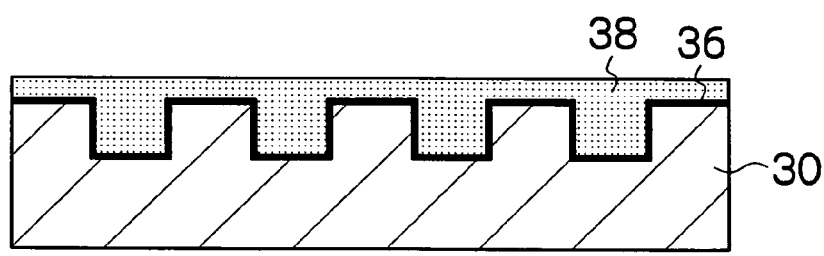

Thereupon, as shown in FIG. 8C, an electroplating process is carried out on the plating layer 36, which is formed by electroless plating. Thereby, a conductive layer 38 which is increased in thickness by the electroplating process is formed.

Figure 8D:
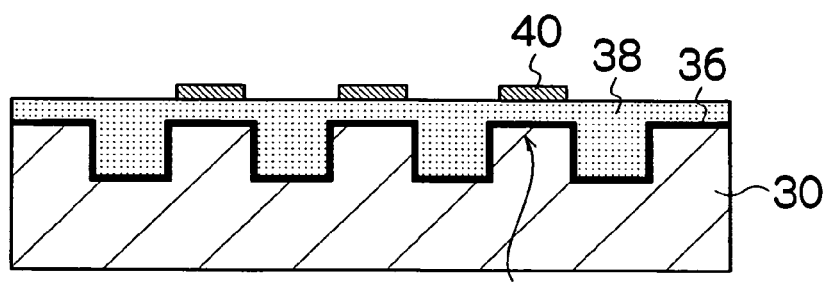

Thereupon, as shown in FIG. 8D, a photo resist process is carried out, and resist patterns 40 which have a narrower width than that of the projecting sections 32 are formed at positions on the conductive layer 38 corresponding to the projecting sections 32 of the substrate 30.

Figure 8E:
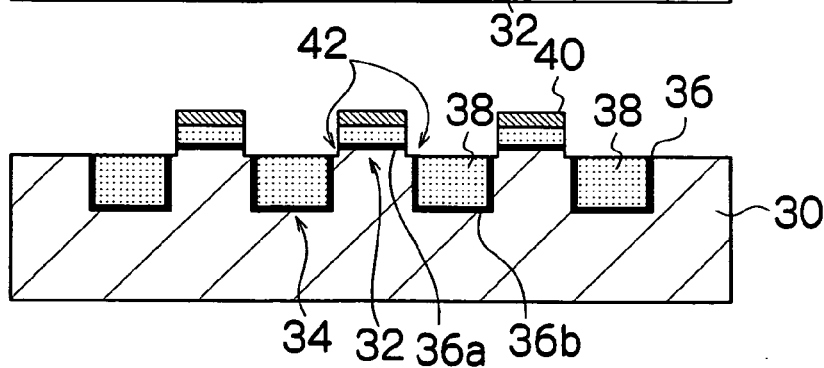

Next, as shown in FIG. 8E, an etching process is carried out so that the conductive layer 38 (or portions of the conductive layer 38) principally in the sections corresponding to the recess sections 34 of the substrate 30, where resist patterns 40 are not formed, is removed. In this case, as shown in FIG. 8E, material is removed up to and including a portion on either side 42 of the upper end section of each projecting section 32 of the substrate 30, and hence the plating layers 36*a* on the projecting sections 32 and the plating layers 36*b* in the recess sections 34 are insulated from each other. Moreover, in this case, the etching is carried out in such a manner that a conductive layer (plating) 38 remains in each of the recess sections 34.

Figure 8F:
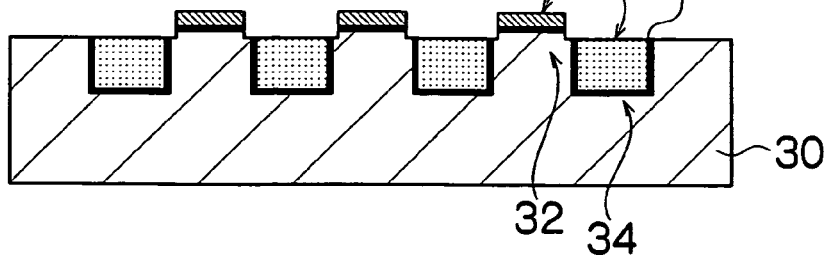

Finally, as shown in FIG. 8F, the resist patterns 40 are removed by means of a prescribed removal solution, or the like, thereby forming a wiring substrate in which wires 42*a* and 42*b* are formed respectively on top of the projecting sections 32 and on top of the recess sections 34.

According to this method of manufacture, it is possible to form wires even if the substrate is made of a soft material, such as prepreg, and furthermore, it is also possible to form wires which partly connect wires in the recess sections to wires on the projecting sections, by means of the resist patterns. Accordingly, the freedom of design of the material and wiring is increased.

In the embodiment described above, high density arrangement of wires is achieved by forming wires on the projecting sections and recess sections formed in a substrate. Next, the formation of a high-density arrangement of wires by means of methods other than such an undulating shape is described below.

Figure 9A:
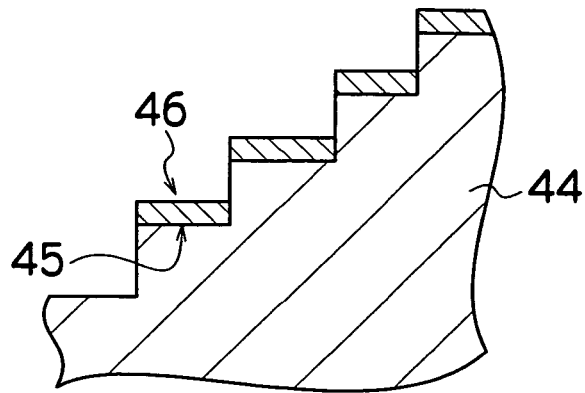
FIGS. 9A to 9C are illustrative diagrams showing an embodiment of a substrate in which wires are formed in a stepped shape.
Figure 9B:
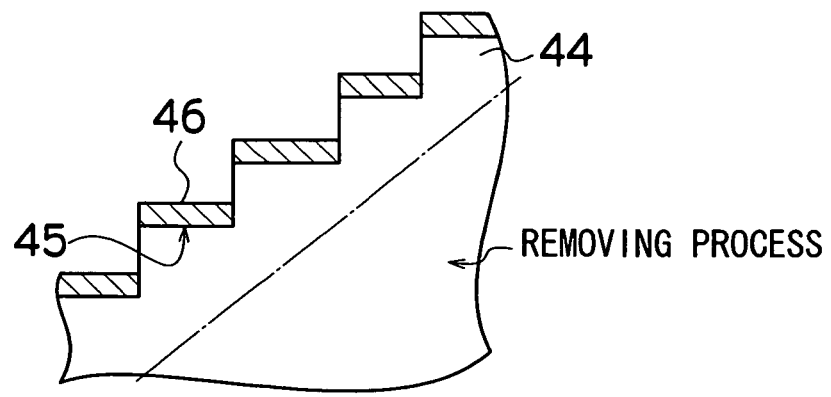
Figure 9C:
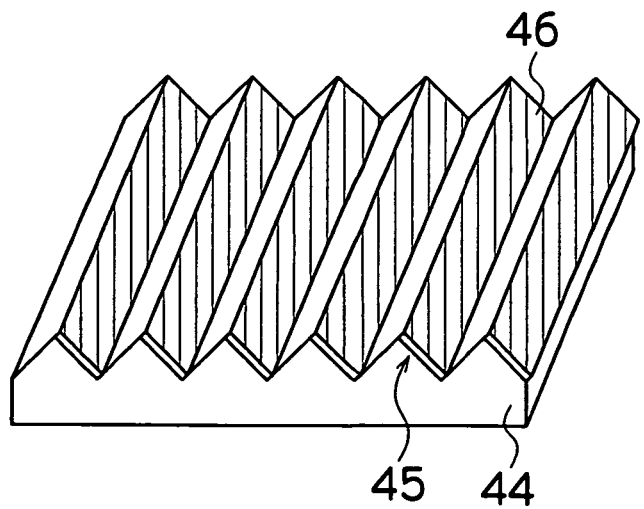

Firstly, FIGS. 9A to 9C show a substrate with a stepped shape. In this case, as shown in FIG. 9A, high density of the wiring is achieved by forming wires 46 on the steps 45 of a substrate 44 formed in a stepped shape. Furthermore, by removing the sections below the dashed line as shown in FIG. 9B, the shape shown entirely in the perspective view of FIG. 9C is formed.

Furthermore, FIGS. 10A to 10D show cases where high-density wiring is achieved on an inclined surface of a substrate.

Figure 10A:
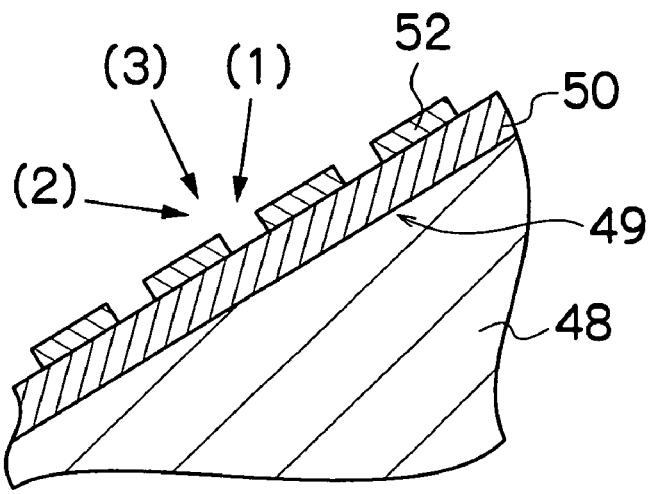
FIGS. 10A to 10D are illustrative diagrams showing an embodiment of a substrate in which high-density wires are formed on an inclined surface.

As shown in FIG. 10A, a conductive layer (plating layer) 50 is formed on an inclined surface 49 of a substrate 48 which is partially formed with an oblique surface, a mask 52 is formed thereon, and etching is carried out thereon in varying direction. Thereby, several wiring patterns as described below can be obtained.

Figure 10B:
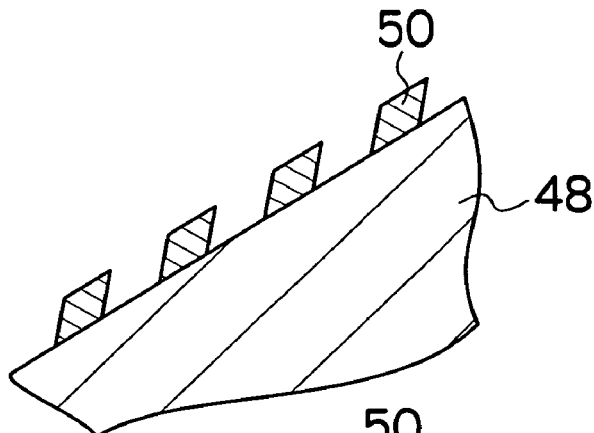

For example, when etching is performed on the inclined surface 49 in a vertical direction, as shown by the arrow (1) in FIG. 10A, then wiring patterns shown in FIG. 10B are obtained.

Figure 10C:
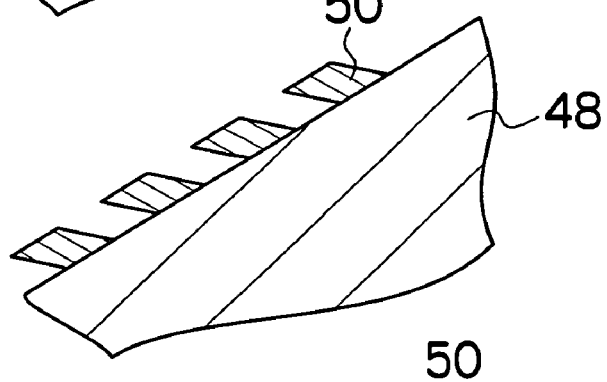
Figure 10D:
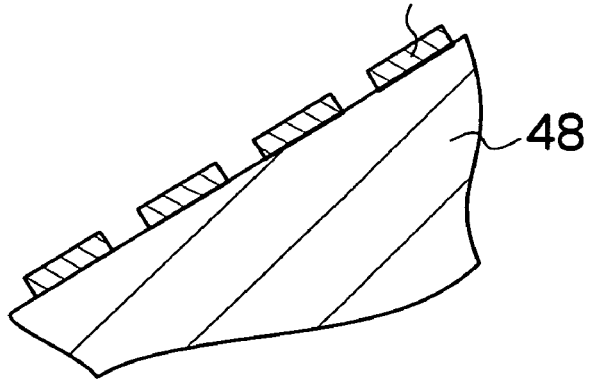

Furthermore, similarly, when etching is performed on the inclined surface 49 in a horizontal direction, as shown by the arrow (2) in FIG. 10A, then wiring patterns shown in FIG. 10C are obtained. Moreover, when etching is performed on the inclined surface 49 in a perpendicular direction (normal direction), as shown by the arrow (3) in FIG. 10A, then wiring patterns shown in FIG. 10D are obtained.

As described above, a wiring substrate formed with wiring patterns of high density is achieved by providing the substrate with an undulating shape and forming wires on both the projecting sections and the recess sections of the substrate.

This high-density wiring substrate can be used in various fields. An embodiment of the high-density wiring substrate is described below in which it is used for the wiring for a piezo cover of a piezoelectric type of inkjet head (liquid droplet ejection head).

Figure 11:
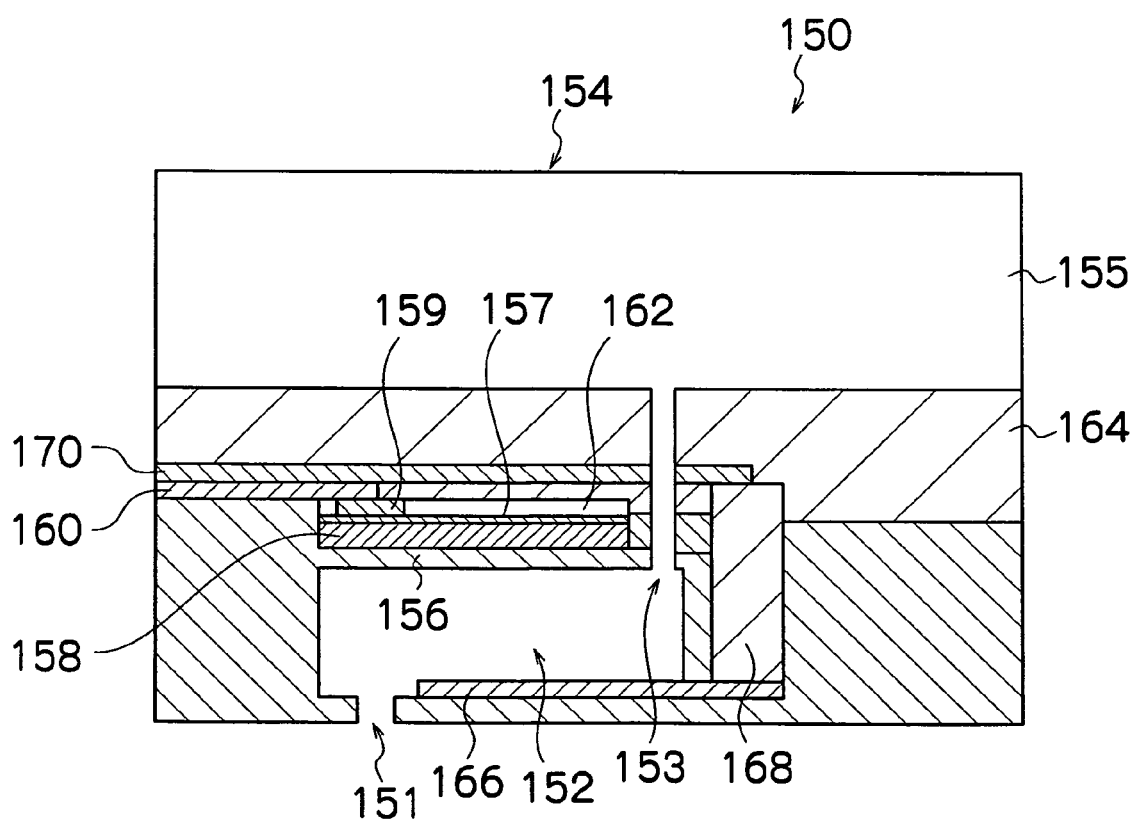
FIG. 11 is a cross-sectional diagram showing a general view of an ink ejection unit which adopts the high-density wiring according to an embodiment of the present invention.

FIG. 11 shows a cross-sectional view of the general composition of one ink ejection unit of an inkjet head in which ink ejection units comprising pressure chambers are arranged in a two-dimensional matrix configuration.

As shown in FIG. 11, the ink ejection unit 154 of the inkjet head 150 comprises: a pressure chamber 152 which is filled with ink; a nozzle 151 which is connected to the pressure chamber 152 and ejects ink; and an ink supply port 153 which supplies ink to the pressure chamber 152 from the common liquid chamber 155.

In FIG. 11, the ceiling of the pressure chamber 152 opposing the nozzle 151 is constituted by a diaphragm 156, and a piezoelectric element 158 which causes the diaphragm 156 to deform is formed on top of the diaphragm 156.

An individual electrode 157 is formed on the upper surface of the piezoelectric element 158, and therefore the piezoelectric element 158 is sandwiched between the individual electrode 157 and the diaphragm 156, which also serves as a common electrode. Furthermore, a piezoelectric element drive wire 160 for supplying a drive signal to the individual electrode 157 is connected electrically to the individual electrode 157 via the drive electrode 159.

Moreover, a space 162 which allows the piezoelectric element 158 to be driven freely, and a piezo cover 164 which serves to protect the piezoelectric element 158, are formed on the upper side of the piezoelectric element 158. A common liquid chamber 155 which accumulates ink for supplying it to the pressure chamber 152 is formed on the upper side of the piezo cover 164.

Furthermore, a pressure determination sensor 166 for determining the pressure of the ink inside the pressure chamber 152 is provided on the base surface of each pressure chamber 152. In order to acquire a determination signal from a pressure determination sensor 166, a column-shaped sensor electrode 168 is formed in a substantially perpendicular fashion from the pressure determination sensor 166, and the sensor electrode 168 is connected electrically to a sensor wire 170 on the upper side thereof.

The piezoelectric element drive wire 160 and the sensor wire 170 are formed with the piezo cover 164. Although described in more detail below, the piezoelectric element drive wire 160 and the sensor wire 170 are formed respectively on a projecting section and a recess section of the undulating shape region formed in the piezo cover 164.

Figure 12A:
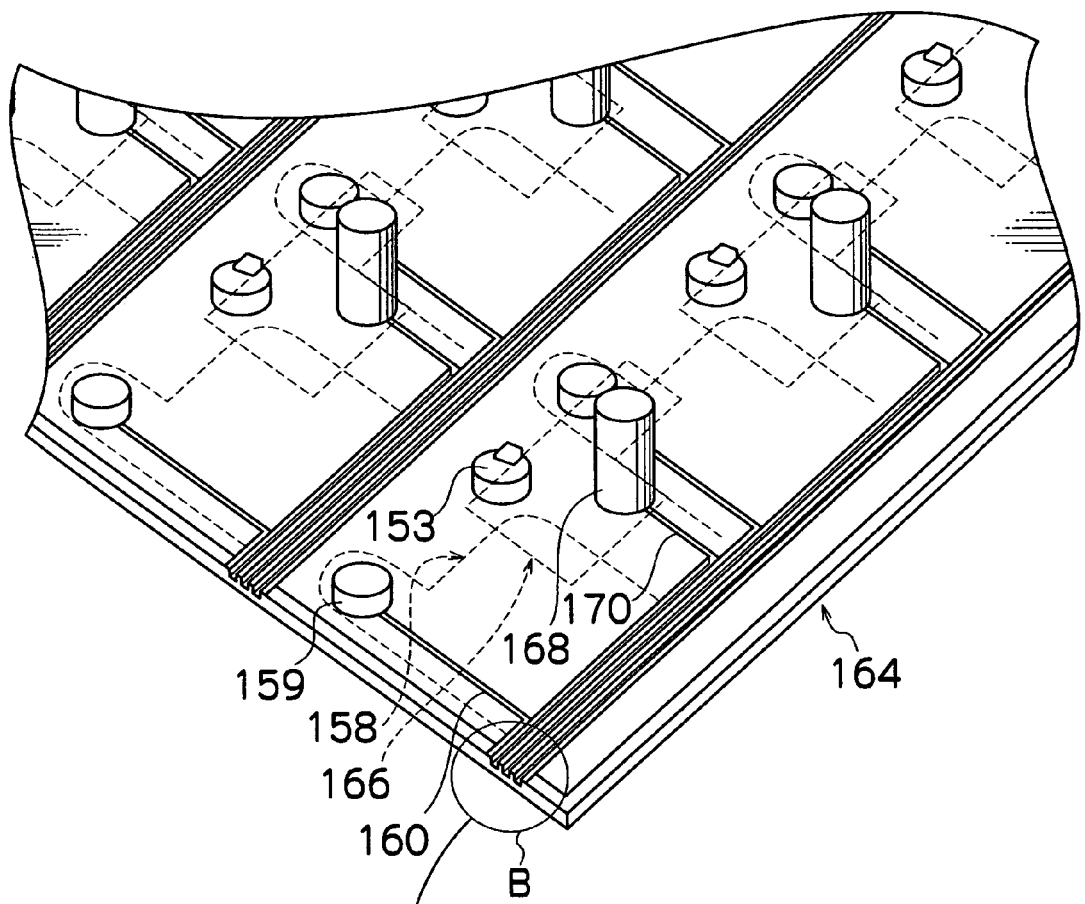
FIG. 12A is an oblique diagram showing an aspect of a piezo cover of the ink ejection unit in FIG. 11, as viewed from the side of the pressure chambers.

FIG. 12A shows an oblique view of the situation of a piezo cover 164 viewed from the side of the pressure chambers.

In FIG. 12A, in order to make the connections of the wires formed with the piezo cover 164 easier to understand, in addition to the piezo cover 164, the diagram also depicts the drive electrodes 159 connected to the individual electrodes 157 on the piezoelectric elements 158, and the column-shaped sensor electrodes 168 connected to the pressure determination sensors 166.

Furthermore, the positional relationships among the drive electrodes 159, the sensor electrodes 168, the piezoelectric elements 158, and the pressure determination sensors 166 are indicated by the dotted lines in FIG. 12A. Moreover, the holes of the supply ports 153 formed in the piezo cover 164 are also depicted.

FIG. 12A shows the piezo cover 164 viewed from the side of the pressure chambers 152, and therefore the piezoelectric element drive wires 160 and the sensor wires 170, which are respectively connected to the drive electrodes 159 and the column-shaped sensor electrodes 168, are connected to the lower sides of the drive electrodes 159 and column-shaped sensor electrodes 168 shown in FIG. 12A.

The piezoelectric element drive wires 160 and the sensor wires 170 are extended to the outer side of the regions corresponding to the pressure chambers 152, and then gathered together between the columns of pressure chambers 152 in the two-dimensional arrangement and wired following the column of pressure chambers 152.

Figure 12B:
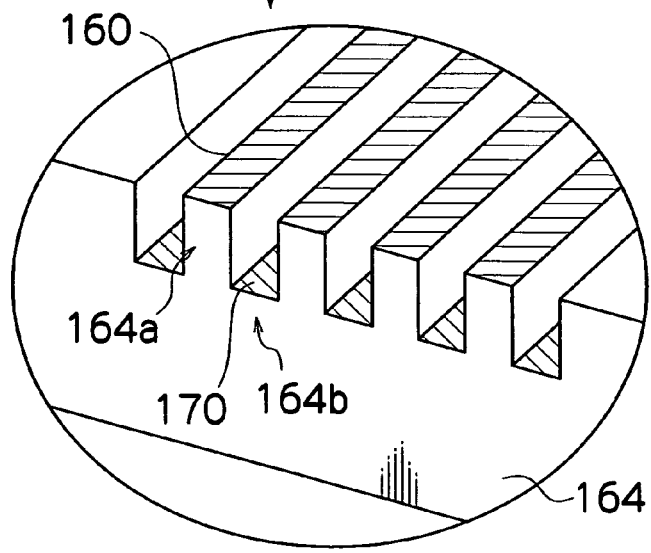
FIG. 12B is an enlarged diagram showing an enlargement of the portion of FIG. 12A indicated by the circle B.

In order to clarify the shape of this wiring, FIG. 12B shows an enlarged view of the portion indicated by circle B in FIG. 12A.

As shown in FIG. 12B, the piezoelectric element drive wires 160 are formed on the projecting sections 164a of the undulating shape region formed on the surface of the piezo cover 164, and the sensor wires 170 are formed on the recess sections 164b.

Desirably, the wiring resistance of the sensor wires 170 is low, whereas the wiring resistance of the piezoelectric element drive wires 160 is higher than that of the sensor wires 170.

The sensors are used for determining very slight changes in pressure and are therefore required to have high resolution. However, if the wires have high resistance, then there is loss, and it is difficult to achieve high resolution. Furthermore, if noise is picked up, then this can lead to erroneous determination and cause system faults. Therefore, it is necessary to achieve an output that exceeds the noise level, and this requires a low resistance.

On the other hand, in the case of the piezoelectric element drive wires 160, even if the resistance is high, no problems arise by devising the wires in such a manner that the wiring resistances to the piezoelectric elements are matching, for example.

In this way, by providing the substrate (piezo cover 164) with an undulating shape and forming wires on the projecting sections and recess sections of this undulating shape, it is possible to achieve a high-density wiring arrangement, and it is possible to make a liquid droplet ejection head (inkjet head) more compact in size.

Furthermore, by employing the manufacturing steps described above, the manufacture of the apparatus (liquid droplet ejection head) becomes simpler, and cost reductions can also be achieved.

The wiring substrate, the method of manufacturing a wiring substrate, and the liquid droplet ejection head, according to embodiments of the present invention have been described in detail above, but the present invention is not limited to the aforementioned embodiments, and it is of course possible for improvements or modifications of various kinds to be implemented, within a range which does not deviate from the essence of the present invention.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A liquid ejection head comprising:
   a pressure chamber configured to be filled with ink;
   a piezoelectric element configured to apply pressure to the ink inside the pressure chamber when the piezoelectric element is driven by a drive signal;
   a nozzle through which the ink is elected from the pressure chamber when the piezoelectric element applies the pressure to the ink inside the pressure chamber;
   a pressure determination sensor configured to determine the pressure of the ink inside the pressure chamber and output a pressure determination signal; and
   a wiring substrate comprising:
   a recess section and a projecting section formed on one surface of the wiring substrate; and
   a first wire formed on the recess section and a second wire formed on the projecting section, the first wire and the second wire being electrically insulated from each other, wherein
   one of the first wire and the second wire is connected to the piezoelectric element and conducts the drive signal applied to the piezoelectric element;

an other of the first wire and the second wire is connected to the pressure determination sensor and conducts the pressure determination signal output from the pressure determination sensor; and an electrical resistance of the one of the first wire and the second wire connected to the piezoelectric element is higher than an electrical resistance of the other of the first wire and the second wire connected to the pressure determination sensor.

2. The liquid ejection head as defined in claim 1, wherein the recess section and the projecting section have non-uniform shape, and bottom surfaces of the recess section have an overall curvature opposite to a direction of warping of the wiring substrate in such a manner that the wiring substrate is prevented from warping in the direction of warping.

* * * * *